United States Patent
Uehling (10) Patent No.: US 8,314,026 B2
(45) Date of Patent: Nov. 20, 2012

(54) ANCHORED CONDUCTIVE VIA AND METHOD FOR FORMING

(75) Inventor: Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/029,205

(22) Filed: Feb. 17, 2011

(65) Prior Publication Data

US 2012/0211883 A1    Aug. 23, 2012

(51) Int. Cl.
*H01L 21/00* (2006.01)

(52) U.S. Cl. ......... 438/637; 438/640

(58) Field of Classification Search ......... 438/612–616, 438/637–640
See application file for complete search history.

(56) References Cited

U.S. PATENT DOCUMENTS

| | | | |
|---|---|---|---|
| 5,169,680 A * | 12/1992 | Ting et al. | 438/629 |
| 5,619,071 A | 4/1997 | Myers et al. | |
| 6,531,384 B1 | 3/2003 | Kobayashi et al. | |
| 7,190,078 B2 | 3/2007 | Khandekar et al. | |
| 2003/0181032 A1 * | 9/2003 | Kawano | 438/633 |
| 2004/0102035 A1 * | 5/2004 | Lee | 438/637 |
| 2005/0121803 A1 | 6/2005 | Angell et al. | |
| 2009/0139568 A1 * | 6/2009 | Weidman et al. | 136/256 |
| 2010/0019395 A1 | 1/2010 | Zecri | |

* cited by examiner

*Primary Examiner* — Richard A. Booth (74) *Attorney, Agent, or Firm* — Joanna G. Chiu; David G. Dolezal (57) ABSTRACT

A conductive via and a method of forming. The conductive via includes a portion located between a conductive contact structure and an overhang portion of a dielectric layer located above the conductive contact structure. In one embodiment, the overhang portion is formed by forming an undercutting layer over the conductive contact structure and then forming a dielectric layer over the conductive contact structure and the undercutting layer. An opening is formed in the dielectric layer and material of the undercutting layer is removed through the opening to create an overhang portion of the dielectric layer. Conductive material of the conductive via is then formed under the overhang portion and in the opening.

20 Claims, 5 Drawing Sheets

ANCHORED CONDUCTIVE VIA AND METHOD FOR FORMING

BACKGROUND

1. Field

This disclosure relates generally to semiconductor processing, and more specifically, to an anchored conductive via and method for forming.

2. Related Art

In semiconductor processing, adhesion of metal layers to underlying surfaces are sometimes not strong enough to withstand mechanical or thermal stresses from the semiconductor package. This may lead to the lifting or separation of metal layers from the underlying surface. This lifting or separation may result, for example, in an electrical open circuit or provide a path for moisture or contaminant ingression.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an anchored conductive via is formed over a metal pad in order to improve adhesion of the conductive via to the underlying metal pad. In one embodiment, a dielectric layer is formed over a metal pad, and an opening is formed in the dielectric layer resulting in an overhang portion of the dielectric layer over the metal pad. The opening is then at least partially filled with a conductive material to form a conductive via, in which the conductive material is formed beneath the overhang portion to form an anchor portion of the conductive via which extends under the overhang portion of the dielectric. In this manner, the anchor portion may allow for improved adhesion of the conductive via to the underlying metal pad. In one embodiment, the conductive material is formed having a tensile internal stress such that it is pressured against the overhang portion of the dielectric. In this manner, gaps between the dielectric layer and the conductive via may be further reduced.

Figure 1:
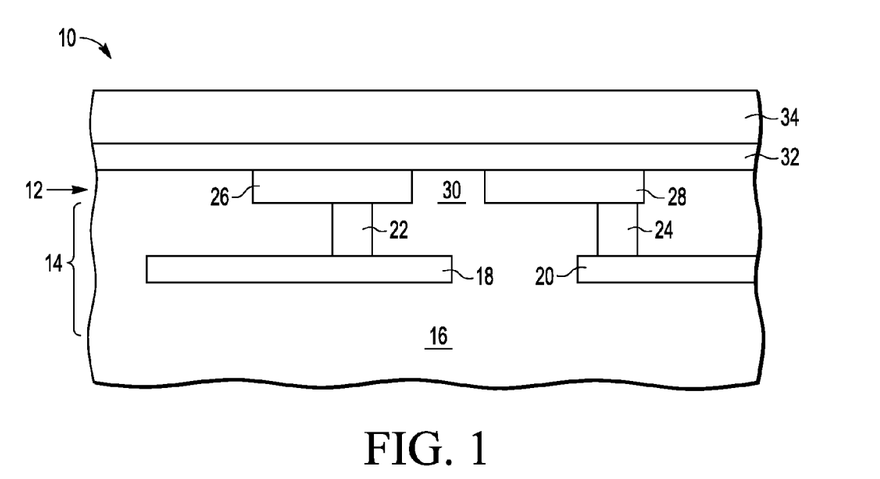
FIG. 1 illustrates a semiconductor structure 10 at a stage in processing, in accordance with one embodiment of the present invention.

FIG. 1 illustrates, in accordance with one embodiment of the present invention, a semiconductor structure 10 having a device structure 16 which includes a plurality of interconnect layers 14 and a final metal layer 12. Note that device structure 16 may be a part of an integrated circuit, and may be a portion of a wafer or work piece. Final metal layer 12 includes a metal pad 26 and a metal pad 28 at a top surface of device structure 16. Metal pads 26 and 28 may be formed of metal such as, for example, copper or aluminum. Note that each of metal pad 26 and 28 may also be referred to as a conductive contact structure. Interconnect layers 14 may include any number of interconnect layers which may be used to route electrical signals between final metal layer 12 and any devices within device structure 16 underlying interconnect layers 14. Interconnect layers 14 includes conductive interconnects 18 and 20, and conductive vias 22 and 24, in which conductive via 22 electrically connects conductive interconnect 18 to metal pad 26 and conductive via 24 electrically connects conductive interconnect 20 to metal pad 28. The conductive portions of interconnect layers 14 (e.g. conductive vias 22 and 24 and conductive interconnects 18 and 20) can be formed of, for example, copper or aluminum. Device structure 16 includes an inter layer dielectric (ILD) 30 which surrounds the conductive portions of metal layer 12 and interconnect layers 14. Note that, as will be described below in reference to alternate embodiments, metal layer 12 may not be the final metal layer in that additional interconnect layers may be formed subsequent to metal layer 12.

Still referring to FIG. 1, structure 10 includes an undercutting layer 32 formed over device structure 16 (over metal pads 26 and 28 and over ILD 30). Each of metal pads 26 and 28 has a top surface of a conductive material, and undercutting layer 32 is of a different material than the surfaces of metal pads 26 and 28. In one embodiment, undercutting layer 32 may be a dielectric material such as, for example, silicon dioxide. Also, in one embodiment, undercutting layer 32 may be formed of a different dielectric material than ILD 30. Structure 10 also includes a passivation layer 34 formed over undercutting layer 32. Passivation layer 34 may be referred to as a dielectric layer and may include any suitable dielectric material. In one embodiment, undercutting layer 32 is an adhesion layer which adheres to overlying passivation layer 34 and to underlying final metal layer 12. Note that the devices of device structure 16 may be of any type and may be formed on any type of semiconductor substrate. For example, the semiconductor substrate may include any semiconductor material or combinations of materials, such as gallium arsenide, silicon germanium, silicon-on-insulator (SOI), silicon, monocrystalline silicon, the like, and combinations of the above. Also, in one embodiment, undercutting layer 32 is formed over areas of the surface of device structure 16 (which may be part of a work piece) which are outside the conductive contact structures (outside of metal pads 26 and 28). Similarly, passivation layer 34 may also be formed over areas of the surface of device structure 16 outside the conductive contact structures.

Figure 2:
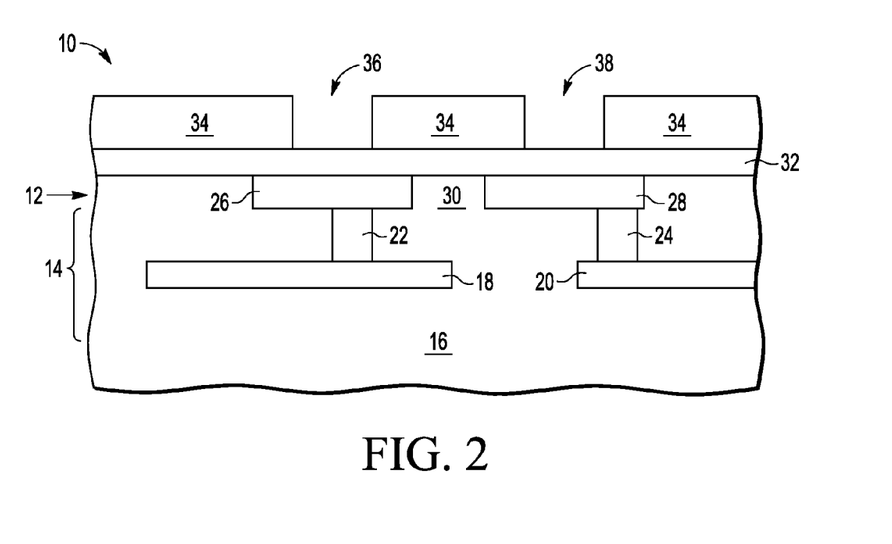
FIG. 2 illustrates semiconductor structure 10 of FIG. 1 at a subsequent stage in processing, in accordance with one embodiment of the present invention.

FIG. 2 illustrates structure 10 of FIG. 1 after the formation of openings 36 and 38 in passivation layer 34 over metal pad 26 and metal pad 28, respectively, in accordance with one embodiment of the present invention. In one embodiment, an etch is performed through passivation layer 34 to expose undercutting layer 32 over metal pads 26 and 28. Therefore, each of openings 36 and 38 (over metal pad 26 and 28, respectively) exposes an underlying portion of undercutting layer 32.

Figure 3:
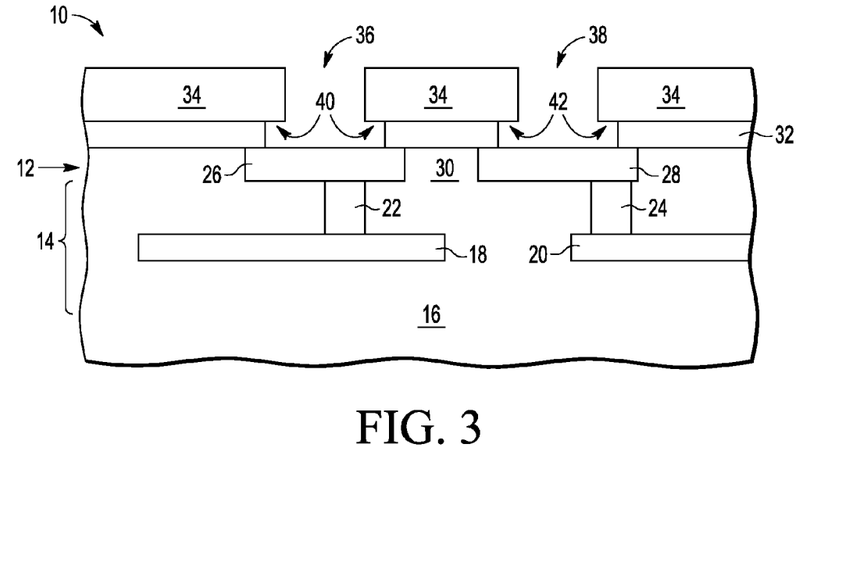
FIG. 3 illustrates semiconductor structure 10 of FIG. 2 at a subsequent stage in processing, in accordance with one embodiment of the present invention.

FIG. 3 illustrates structure 10 of FIG. 2 after extending openings 36 and 38 to expose metal pads 26 and 28, respectively, in accordance with one embodiment of the present invention. Openings 36 and 38 are formed such that they expose underlying metal pads 26 and 28, respectively, and result in an overhang portion of passivation layer 34 adjacent to each of openings 36 and 38. For example, in one embodiment, an isotropic etch is performed such that portions of undercutting layer 32 within each of openings 36 and 38 are removed so as to undercut passivation layer 34. (Therefore, note that undercutting layer 32 is a material which can be selectively etched with respect to passivation layer 34.) In this manner, passivation layer 34 includes an overhang portion 40 adjacent opening 36 and an overhang portion 42 adjacent opening 38. Therefore, note that opening 36 includes a bottom portion, located between metal pad 26 and passivation layer 34, that has a wider opening than a top portion within passivation layer 34. Similarly, opening 38 includes a bottom portion, located between metal pad 28 and passivation layer 34, that has a wider opening than a top portion within passivation layer 34. As illustrated in FIG. 3, the top surfaces of metal pads 26 and 28 are exposed through openings 36 and 38, respectively, in which an opening formed by the removal of portions of undercutting layer 32 is wider than the openings in passivation layer 34 such that passivation layer 34 has overhang portions 40 and 42 adjacent openings 36 and 38, respectively. Also, note that after the extending of openings 36 and 38, portions of undercutting layer 32 surrounding metals pads 26 and 28 remain.

Figure 4:
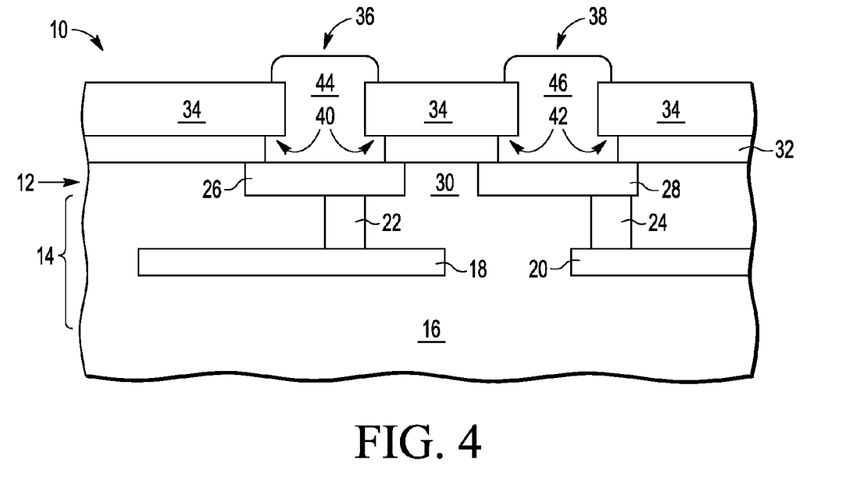
FIG. 4 illustrates semiconductor structure 10 of FIG. 3 at a subsequent stage in processing, in accordance with one embodiment of the present invention.

FIG. 4 illustrates structure 10 of FIG. 3 after filling openings 36 and 38 with a conductive material, in accordance with one embodiment of the present invention. In one embodiment, a conductive material 44 (also referred to as a conductive fill material) is formed in opening 36 such that conductive material 44 fills the undercut formed by undercutting layer 32. That is, conductive material 44 is formed under overhang portion 40 of passivation layer 34 over metal pad 26. Similarly, a conductive material 46 is formed in opening 38 such that conductive material 46 fills the undercut formed by undercutting layer 32 such that conductive material 46 is formed under overhang portion 42 of passivation layer 34 over metal pad 28. In one embodiment, each of conductive material 44 and 46 includes a metal such as nickel, aluminum, or copper. In one embodiment, each of conductive material 44 and 46 have a nickel content of 85% or greater by weight. In one embodiment, conductive material 44 and 46 are plated metals formed by electroless plating of a metal within openings 36 and 38. In the illustrated embodiment, conductive material 44 and 46 are formed such that they overflow onto a top surface of passivation layer 34 surrounding each of openings 36 and 38. However, in an alternate embodiment, conductive material 44 and 46 may be formed such that they remain substantially flush with the top surface of passivation layer 34 or below the top surface of passivation layer 34. That is, conductive material 44 and 46 fill the openings formed by the removal of undercutting layer 32 and at least partially fill openings 36 and 38 within passivation layer 34. Therefore, it can be seen how each of conductive material 44 and 46 form an anchored conductive via by filling in those locations beneath the overhang portions of passivation layer 34.

Furthermore, in one embodiment, conductive materials 44 and 46 are formed such that they have an internal tensile stress. In this manner, conductive material 44 contracts so as to assert pressure against overhang portion 40 of passivation layer 34 such that the portions of conductive material 44 which surround passivation layer 34 clamps passivation layer 34. For example, conductive material 44 between overhang portion 40 and metal pad 26 provides an upward pressure to overhang portion 40, and conductive material 44 which overlaps onto the top surface of passivation layer 34 provides a downward pressure to the top surface passivation layer 34. The same description applies to conductive material 46 which asserts pressure against overhang portion 42 of passivation layer 34 such that conductive material 42 clamps passivation layer 34. If conductive materials 44 and 46 do not overlap onto a top surface of passivation layer 34, improved adhesion is still achieved by the upward pressure applied by the conductive material to the overhang portions of passivation layer 34. Also, note that the pressure provided by the internal tensile stress may also help reduce any gaps which may exists between conductive materials 44 and 46 and passivation layer 34. In one embodiment, the internal tensile stress is achieved during the electroless plating processor by having the phosphorous content of the plating solution be in a range of 5.0% to 10.0% by weight, by adjusting the pH of the plating solution to 4 or greater, by a plating process having a current density at 3 Amps per decimeter squared ($A/dm^2$) or less, or by combinations thereof. In one embodiment, processing of the structure 10 may be complete such that it is part of an integrated circuit and is singulated from a wafer or subsequently packaged.

Figure 5:
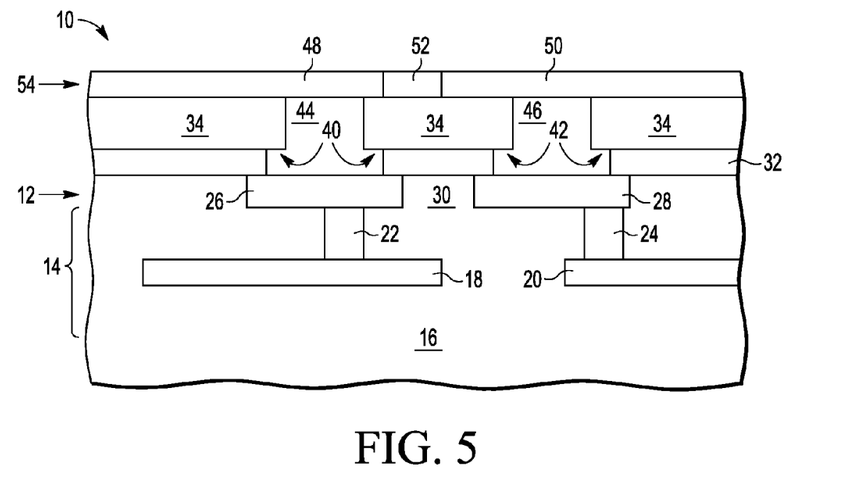
FIG. 5 illustrates semiconductor structure 10 of FIG. 4 at a subsequent stage in processing, in accordance with one embodiment of the present invention.

FIG. 5 illustrates structure 10 in which an additional interconnect layer is formed over metal layer 12, in accordance with one embodiment in which metal layer 12 is not the final metal layer of devices structure 16. For example, as mentioned above, metal layer 12 may be an intermediate metal layer in which anchored conductive vias are formed to improve adhesion, for example, between intermediate metal layers. In the embodiment of FIG. 5, an interconnect layer 54 is formed over passivation layer 34 and conductive vias 44 and 46. (In one embodiment, after filling openings 36 and 38 with a conductive material, a planarization may be performed, such as, for example, a chemical mechanical polishing (CMP) may be performed.) Interconnect layer 54 includes a patterned metal layer having conductive interconnect portions 48 and 50 in electrical contact (i.e. in electrical conduction) with conductive vias 44 and 46, respectively, and an ILD 52 between the conductive interconnect portions. Therefore, subsequent processing may continue to form as many interconnect layers as needed for the integrated circuit.

Figure 6:
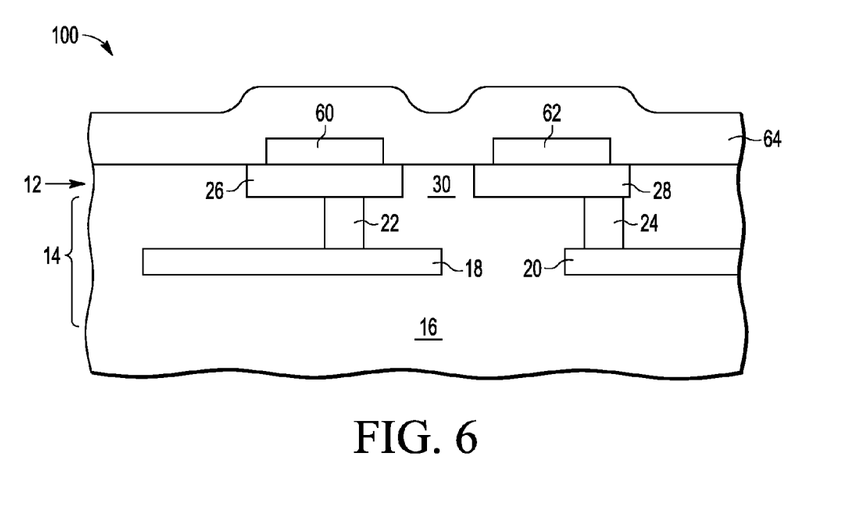
FIG. 6 illustrates a semiconductor structure 100 at a stage in processing, in accordance with one embodiment of the present invention.

FIG. 6 illustrates a structure 100 in accordance with one embodiment of the present invention. Structure 100 includes device structure 16 (which is similar to device structure 16 of structure 10, therefore, all the descriptions provided above with respect to device structure 16 of structure 10 and the elements therein which have like numerals also apply to FIGS. 6-9). Structure 100 also includes a patterned layer of undercutting material having a first physically isolated structure 60 over metal pad 26 and a second physically isolated structure 62 over metal pad 28. Note that patterned layer of undercutting material may have any number of physically isolated structures of undercutting material as needed for metal layer 12. Also, note that physically isolated structures 60 and 62 may also be referred to as undercutting layer portions 60 and 62. In one embodiment, the patterned layer of undercutting material (e.g. undercutting layer portion 60 and undercutting layer portion 62) includes a material different from the conductive material of the top surfaces of metal pads 26 and 28. In one embodiment, the patterned layer of undercutting material includes a dielectric material, such as, for example, silicon oxide or silicon nitride. Alternatively, the undercutting layer portions may include a conductive material, such as aluminum. In this embodiment, the conductive material of the undercutting material may be different from the undercutting material of metal pads 26 and 28. In one embodiment, formation of the patterned layer of undercutting material includes forming an undercutting layer over a surface of device structure 16 (which may be part of a work piece), in which the undercutting layer is formed over areas of device structure 16 which are outside the conductive contact structures (such as metal pads 26 and 28). Subsequently, the undercutting layer may be patterned to form physically isolated structures 60 and 62 over metal pads 26 and 28, respectively.

Still referring to FIG. 6, a passivation layer 64 (also referred to as a dielectric layer) is formed over the patterned layer of undercutting material. That is, it is formed over undercutting layer portions 60 and 62 and over metal layer 12 and metal pads 26 and 28. Note that passivation layer 64 may be formed using multiple dielectric layers and may include any suitable dielectric material. Also, note that passivation layer 64 surrounds all peripheral sides of each physically isolated structure 60 and 62.

Figure 7:
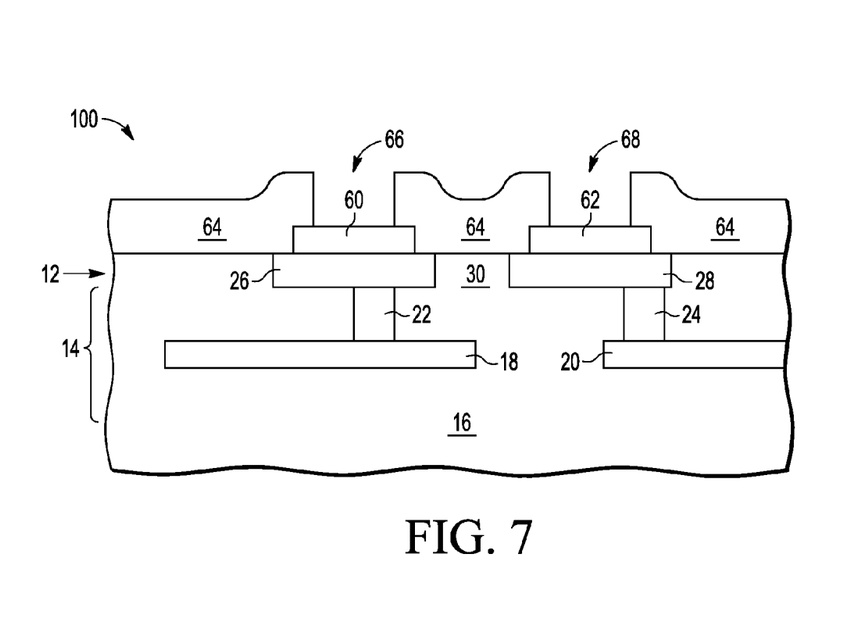
FIG. 7 illustrates semiconductor structure 100 of FIG. 6 at a subsequent stage in processing, in accordance with one embodiment of the present invention.

FIG. 7 illustrates structure 100 of FIG. 6 after the formation of openings 66 and 68 in passivation layer 64 over metal pad 26 and metal pad 28, respectively, in accordance with one embodiment of the present invention. In one embodiment, an etch is performed through passivation layer 64 to expose undercutting layer portion 60 over metal pads 26 and to expose undercutting layer portion 62 over metal pad 28. Therefore, each of openings 66 and 68 exposes an underlying portion of the patterned layer of undercutting materials.

Figure 8:
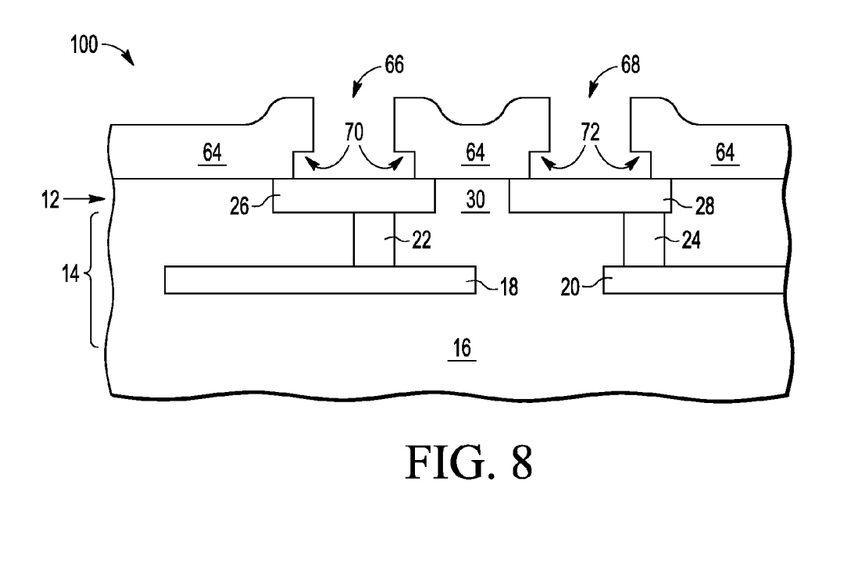
FIG. 8 illustrates semiconductor structure 100 of FIG. 7 at a subsequent stage in processing, in accordance with one embodiment of the present invention.

FIG. 8 illustrates structure 100 of FIG. 7 after extending openings 66 and 68 to expose metal pads 26 and 28, respectively, in accordance with one embodiment of the present invention. Openings 66 and 68 are formed such that they expose underlying metal pads 26 and 28, respectively, and result in an overhang portion of passivation layer 64 adjacent to each of openings 66 and 68. For example, in one embodiment, an isotropic etch is performed such that all or portions of undercutting layer portion 60 within opening 66 and all or portions of undercutting layer portion 62 within opening 68 are removed so as to undercut passivation layer 64. (Therefore, note that the patterned layer of undercutting material includes a material which can be selectively etched with respect to passivation layer 64.) In this manner, passivation layer 64 includes an overhang portion 70 adjacent opening 66 and an overhang portion 72 adjacent opening 68. Therefore, note that opening 66 includes a bottom portion, located between metal pad 26 and overhang portion 70, that has a wider opening than a top portion within passivation layer 64. Similarly, opening 68 includes a bottom portion, located between metal pad 28 and overhang portion 72, that has a wider opening than a top portion within passivation layer 64. As illustrated in FIG. 8, the top surfaces of metal pads 26 and 28 are exposed through openings 66 and 68, respectively, in which openings formed by the removal of undercutting layer portions 60 and 62 are each wider than the corresponding openings in passivation layer 64 such that passivation layer 64 has overhang portions 70 and 72 adjacent openings 66 and 68, respectively.

Figure 9:
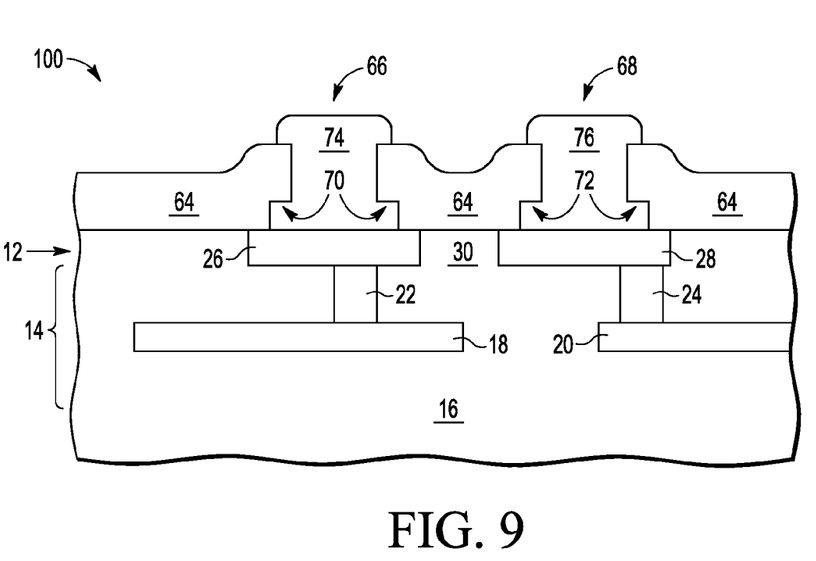
FIG. 9 illustrates semiconductor structure 100 of FIG. 8 at a subsequent stage in processing, in accordance with one embodiment of the present invention.

FIG. 9 illustrates structure 100 of FIG. 8 after filling openings 66 and 68 with a conductive material, in accordance with one embodiment of the present invention. In one embodiment, a conductive material 74 (also referred to as a conductive fill material) is formed in opening 66 such that conductive material 44 fills the undercut formed by undercutting layer portion 60. That is, conductive material 74 is formed under overhang portion 70 of passivation layer 64 over metal pad 26. Similarly, a conductive material 76 is formed in opening 68 such that conductive material 76 fills the undercut formed by undercutting layer portion 62 such that conductive material 76 is formed under overhang portion 72 of passivation layer 64 over metal pad 28. In one embodiment, each of conductive material 74 and 76 includes a metal such as nickel, aluminum, or copper. In one embodiment, each of conductive material 74 and 76 have a nickel content of 85% or greater by weight. In one embodiment, conductive material 74 and 76 are plated metals formed by electroless plating of a metal within openings 66 and 68. In the illustrated embodiment, conductive material 74 and 76 are formed such that they overflow onto a top surface of passivation layer 64 surrounding each of openings 66 and 68. However, in an alternate embodiment, conductive material 74 and 76 may be formed such that they remain substantially flush with the top surface of passivation layer 64 or below the top surface of passivation layer 64. That is, conductive material 74 and 76 fill the openings formed by the removal of undercutting layer portions 60 and 62 and at least partially fill openings 66 and 68 within passivation layer 64. Therefore, it can be seen how each of conductive material 74 and 76 form an anchored conductive via by filling in those locations beneath the overhang portions of passivation layer 64.

Furthermore, in one embodiment, conductive materials 74 and 76 are formed such that they have an internal tensile stress. In this manner, conductive material 74 between overhang portion 70 and metal pad 26 provides an upward pressure to overhang portion 70, and conductive material 74 which overlaps onto the top surface of passivation layer 64 provides a downward pressure to the top surface passivation layer 64. The same description applies to conductive material 76. If conductive materials 74 and 76 do not overlap onto a top surface of passivation layer 64, improved adhesion is still achieved by the upward pressure applied by the conductive material to the overhang portions of passivation layer 64. Also, note that the pressure provided by the internal tensile stress may also help reduce any gaps which may exists between conductive materials 74 and 76 and passivation layer 64. In one embodiment, the internal tensile stress is achieved during the electroless plating process by having the phosphorous content of the plating solution be in a range of 5.0% to 10.0% by weight, by adjusting the pH of the plating solution to 4 or greater, by a plating process having a current density at 3 Amps per decimeter squared (A/dm$^2$) or less, or by combinations thereof. In one embodiment, processing of the structure 100 may be complete such that it is part of an integrated circuit and is singulated from a wafer or subsequently packaged. Alternatively, additional interconnect layers may be formed on structure 100, as was described, for example, in reference to the example of FIG. 5 with respect to structure 10.

Therefore, it can be seen how embodiments of FIGS. 1-9 may form an integrated circuit having a conductive contact structure (such as metal pad 26) which has a major top surface and has a topmost point, a dielectric layer (such as passivation layer 34 or 64) located over the major top surface in which the dielectric layer includes an overhang portion (such as portion 40, 42, 70, or 72) over the major top surface. The overhang portions define an opening (such as opening 36, 38, 66, or 68) and the overhang portion has an underside planar surface that is vertically separated from a parallel plane in which the topmost point of the major top surface resides. The integrated circuit may further include a conductive material structure (such as, for example, conductive fill 44, 46, 74, or 76) which is in electrical conduction with the conductive contact structure. The conductive material structure includes a first portion that is vertically located between the underside planar surface of the overhang portion and the major top surface of the conductive contact structure. That is, the conductive material may include a first portion that is located in the undercut regions formed by the removal of the undercutting layer (such as undercutting layer 32 or undercutting layer portions 60 or 62) and beneath the overhang portions. The conductive material structure also includes a second portion that at least partially fills the opening defined by the overhang portion (this opening may be, for example, opening 36 or 38 in passivation layer 34 or opening 66 or 68 in passivation layer 64).

By now it should be appreciated that there has been provided a method for forming an anchored conductive via which may result in improved adhesion and reduced gaps. In one embodiment, a layer of undercutting material under a passivation layer is selectively etched to form an overhang portion of the passivation layer adjacent an opening over exposed metal pads. Conductive material is then formed in the openings and in the undercuts (which resulted from the selective etch) such that the conductive material fills the space between the metal pads and the overhang portions of the passivation layer. These filled undercuts provide anchors for the conductive via which may help maintain better adhesion of the conductive via to the underlying metal pad. Furthermore, the conductive material may be formed such that it has an internal tensile stress.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the anchored conductive vias may be used on final metal layer and/or for intermediate metal layers. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a conductive via including forming a conductive contact structure having a surface of a conductive material; forming an undercutting layer over the conductive contact structure, the undercutting layer being of a different material than the surface of the conductive material; forming a dielectric layer over the undercutting layer and over the conductive contact structure, the undercutting layer located between the dielectric layer and the conductive contact structure; forming an opening in the dielectric layer over the conductive contact structure; removing material of the undercutting layer through the opening in the dielectric layer, wherein the surface of the conductive contact structure is exposed through the opening in the dielectric layer, wherein an opening formed by the removing of the material of the undercutting layer is wider than the opening in the dielectric layer such that the dielectric layer has an overhang portion adjacent the opening in the dielectric layer above the conductive contact structure; and filling the opening formed by the removing of the undercutting material and at least partially filling the opening in the dielectric layer with a conductive fill material, wherein the filling results in the conductive fill material being located between the overhang portion of the dielectric layer and the conductive contact structure. Item 2 includes the method of item 1 wherein the under cutting material is characterized as a dielectric material. Item 3 includes the method of item 1 wherein the undercutting material includes silicon dioxide. Item 4 includes the method of item 3 wherein the dielectric material includes silicon nitride. Item 5 includes the method of item 1 wherein the removing material of the undercutting layer includes using an isotropic etch with an etch chemistry that is selective to the undercutting material and is not selective to the dielectric material. Item 6 includes the method of item 2 wherein the forming the undercutting layer includes forming the undercutting layer over a surface of a work piece, the work piece includes the conductive contact structure, wherein the forming the undercutting layer over the surface of the work piece includes forming the undercutting layer over areas outside the conductive contact structure; the forming the dielectric layer includes forming the dielectric layer over the undercutting layer in the areas outside the conductive contact structure; and the removing material of the undercutting layer results in leaving material of the under cutting layer in at least some of the areas. Item 7 includes the method of item 6 wherein the material of the undercutting layer serves as an adhesion layer for adhering the dielectric layer to a surface of the work piece. Item 8 includes the method of item 1 wherein the forming the undercutting layer includes forming the undercutting layer over a surface of a work piece, the work piece includes the conductive contact structure, wherein the forming the undercutting layer over the surface of the work piece includes forming the undercutting layer over areas outside the conductive contact structure; the forming the undercutting layer includes patterning the undercutting layer to form a physically isolated structure of the undercutting layer over the conductive contact structure; the forming the dielectric layer further includes forming the dielectric layer over the physically isolated structure such that the dielectric layer surrounds all peripheral sides of the physically isolated structure; and wherein a width of the physically isolated structure is wider than the opening in the dielectric layer. Item 9 includes the method of item 8 wherein the removing material of the undercutting layer includes removing all of the material of the physically isolated structure. Item 10 includes the method of item 1 wherein the dielectric layer is characterized as a passivation layer and the conductive contact structure is characterized as a conductive structure located in a final metal layer of an integrated circuit. Item 11 includes the method of item 1 wherein the filling the opening is performed such that the conductive fill material has an internal tensile stress to provide an upward pressure on the overhang portion. Item 12 includes the method of item 11 wherein the at least partially filling the opening includes filling the opening with the conductive fill material above a top surface of the dielectric layer and forming conductive fill material in an area over the top surface of the dielectric layer adjacent to the opening of the dielectric layer, wherein the conductive fill material has an internal tensile stress to provide a downward pressure on the top surface of the dielectric layer at the area adjacent to the opening of the dielectric layer. Item 13 includes the method of item 1 wherein the filling the opening and the at least partially filling the opening are performed by a plating process of the conductive fill material. Item 14 includes the method of item 1 wherein the filling the opening and the at least partially filling the opening are performed by an electroless plating process of the conductive fill material. Item 15 includes the method of item 1 wherein the conductive fill material has a nickel content of at least 85.0% by weight. Item 16 includes the method of item 1 wherein the conductive fill material has a phosphorous content in a range of 5.0% to 10.0% by weight. Item 17 includes the method of item 1 wherein the filling the opening and the partially filling the opening are performed by a plating process using a plating solution having a pH level of 4.0 or greater. Item 18 includes the method of item 1 wherein the filling the opening and the partially filling the opening are performed by a plating process having a current density of 3.0 Amps per decimeter squared or less. Item 19 includes the method of item 1 wherein the at least partially filling the opening includes filling the opening above the top surface of the opening; the method includes planarizing the top surface of the dielectric material and the conductive fill material; and the method further includes forming a conductive structure above the top surface of the planarized conductive fill material and in electrical conduction with the planarized conductive fill material.

Item 20 includes an integrated circuit including a conductive contact structure having a major top surface having a topmost point; a dielectric layer located over the major top surface, the dielectric layer including an overhang portion located over the major top surface, the overhang portion defining an opening, wherein the overhang portion has an underside planar surface that is vertically separated from a parallel plane in which the topmost point of the major top surface resides; and a conductive material structure in electrical conduction with the conductive contact structure, wherein the conductive material structure includes a first portion that is vertically located between the underside planar surface of the overhang portion and the major top surface of the conductive contact structure, the conductive material structure including a second portion that at least partially fills the opening defined by the overhang portion.

What is claimed is:

1. A method of forming a conductive via comprising:
    forming a conductive contact structure having a surface of a conductive material;
    forming an undercutting layer over the conductive contact structure, the undercutting layer being of a different material than the surface of the conductive material;
    forming a dielectric layer over the undercutting layer and over the conductive contact structure, the undercutting layer located between the dielectric layer and the conductive contact structure;
    forming an opening in the dielectric layer over the conductive contact structure;
    removing material of the undercutting layer through the opening in the dielectric layer, wherein the surface of the conductive contact structure is exposed through the opening in the dielectric layer, wherein an opening formed by the removing of the material of the undercutting layer is wider than the opening in the dielectric layer such that the dielectric layer has an overhang portion adjacent the opening in the dielectric layer above the conductive contact structure; and
    filling the opening formed by the removing of the undercutting material and at least partially filling the opening in the dielectric layer with a conductive fill material, wherein the filling results in the conductive fill material being located between the overhang portion of the dielectric layer and the conductive contact structure, wherein:
        the filling the opening is performed such that the conductive fill material has an internal tensile stress to provide an upward pressure on the overhang portion, and
        the at least partially filling the opening includes filling the opening with the conductive fill material above a top surface of the dielectric layer and forming conductive fill material in an area over the to surface of the dielectric layer adjacent to the opening of the dielectric layer, wherein the conductive fill material has an internal tensile stress to provide a downward pressure on the top surface of the dielectric layer at the area adjacent to the opening of the dielectric layer.

2. The method of claim 1 wherein the under cutting material is characterized as a dielectric material.

3. The method of claim 1 wherein the undercutting material includes silicon dioxide.

4. The method of claim 3 wherein the dielectric material includes silicon nitride.

5. The method of claim 1 wherein the removing material of the undercutting layer includes using an isotropic etch with an etch chemistry that is selective to the undercutting material and is not selective to the dielectric material.

6. The method of claim 1 wherein:
    the forming the undercutting layer includes forming the undercutting layer over a surface of a work piece, the work piece includes the conductive contact structure, wherein the forming the undercutting layer over the surface of the work piece includes forming the undercutting layer over areas outside the conductive contact structure;
    the forming the dielectric layer includes forming the dielectric layer over the undercutting layer in the areas outside the conductive contact structure;
    the removing material of the undercutting layer results in leaving material of the under cutting layer in at least some of the areas.

7. The method of claim 6 wherein the material of the undercutting layer serves as an adhesion layer for adhering the dielectric layer to a surface of the work piece.

8. A method of forming a conductive via, comprising:
    forming a conductive contact structure having a surface of a conductive material;
    forming an undercutting layer over the conductive contact structure, the undercutting layer being of a different material than the surface of the conductive material;
    forming a dielectric layer over the undercutting layer and over the conductive contact structure, the undercutting layer located between the dielectric layer and the conductive contact structure;
    forming an opening in the dielectric layer over the conductive contact structure;

removing material of the undercutting layer through the opening in the dielectric layer, wherein the surface of the conductive contact structure is exposed through the opening in the dielectric layer, wherein an opening formed by the removing of the material of the undercutting layer is wider than the opening in the dielectric layer such that the dielectric layer has an overhang portion adjacent the opening in the dielectric layer above the conductive contact structure; and filling the opening formed by the removing of the undercutting material and at least partially filling the opening in the dielectric layer with a conductive fill material, wherein the filling results in the conductive fill material being located between the overhang portion of the dielectric layer and the conductive contact structure, wherein:

the forming the undercutting layer includes forming the undercutting layer over a surface of a work piece, the work piece includes the conductive contact structure, wherein the forming the undercutting layer over the surface of the work piece includes forming the undercutting layer over areas outside the conductive contact structure;

the forming the undercutting layer includes patterning the undercutting layer to form a physically isolated structure of the undercutting layer over the conductive contact structure;

the forming the dielectric layer further includes forming the dielectric layer over the physically isolated structure such that the dielectric layer surrounds all peripheral sides of the physically isolated structure;

wherein a width of the physically isolated structure is wider than the opening in the dielectric layer.

9. The method of claim 8 wherein the removing material of the undercutting layer includes removing all of the material of the physically isolated structure.

10. The method of claim 1 wherein the dielectric layer is characterized as a passivation layer and the conductive contact structure is characterized as a conductive structure located in a final metal layer of an integrated circuit.

11. The method of claim 1 wherein the forming conductive fill material is performed such that the conductive fill material is over and in direct contact with the top surface of the dielectric layer adjacent to the opening of the dielectric layer.

12. The method of claim 11 wherein the dielectric layer is characterized as a passivation layer and the conductive contact structure is characterized as a conductive structure located in a final metal layer of an integrated circuit.

13. The method of claim 1 wherein the filling the opening and the at least partially filling the opening are performed by a plating process of the conductive fill material.

14. The method of claim 1 wherein the filling the opening and the at least partially filling the opening are performed by an electroless plating process of the conductive fill material.

15. The method of claim 1 wherein the conductive fill material has a nickel content of at least 85.0% by weight.

16. The method of claim 1 wherein the conductive fill material has a phosphorous content in a range of 5.0% to 10.0% by weight.

17. The method of claim 1 wherein the filling the opening and the partially filling the opening are performed by a plating process using a plating solution having a pH level of 4.0 or greater.

18. The method of claim 1 wherein the filling the opening and the partially filling the opening are performed by a plating process having a current density of 3.0 Amps per decimeter squared or less.

19. The method of claim 1 wherein:
the at least partially filling the opening includes filling the opening above the top surface of the opening;
the method includes planarizing the top surface of the dielectric material and the conductive fill material;
the method further includes forming a conductive structure above the top surface of the planarized conductive fill material and in electrical conduction with the planarized conductive fill material.

20. The method of claim 8 wherein the dielectric layer is characterized as a passivation layer and the conductive contact structure is characterized as a conductive structure located in a final metal layer of an integrated circuit.

* * * * *